(12) United States Patent
Rivoir

(10) Patent No.: US 7,672,804 B2
(45) Date of Patent: Mar. 2, 2010

(54) ANALOG SIGNAL TEST USING A-PRIORI INFORMATION

(75) Inventor: Jochen Rivoir, Magstadt (DE)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/897,847

(22) Filed: Aug. 31, 2007

(65) Prior Publication Data
US 2009/0063100 A1    Mar. 5, 2009

(51) Int. Cl.
G01R 31/00    (2006.01)
G06F 19/00    (2006.01)

(52) U.S. Cl. ..................................... 702/124
(58) Field of Classification Search ................ 702/124, 702/66, 71, 108; 324/620, 613
See application file for complete search history.

(56) References Cited

U.S. PATENT DOCUMENTS

| | | | |
|---|---|---|---|
| 4,255,792 A | 3/1981 | Das | |
| 4,580,126 A | 4/1986 | Kato et al. | |
| 5,179,344 A * | 1/1993 | Najle et al. | 324/613 |
| 5,453,995 A | 9/1995 | Behrens | |
| 5,499,248 A | 3/1996 | Behrens et al. | |
| 5,528,603 A | 6/1996 | Canella et al. | |
| 5,687,288 A | 11/1997 | Dobler et al. | |
| 5,734,674 A * | 3/1998 | Fenton et al. | 375/150 |
| 6,307,896 B1 * | 10/2001 | Gumm et al. | 375/316 |
| 7,035,324 B2 * | 4/2006 | Mar et al. | 375/224 |
| 2002/0017901 A1 * | 2/2002 | Otsubo et al. | 324/76.38 |
| 2004/0070409 A1 | 4/2004 | Mobley | |
| 2005/0206545 A1 * | 9/2005 | Kobayashi et al. | 341/145 |
| 2006/0010360 A1 * | 1/2006 | Kojima | 714/738 |
| 2006/0267637 A1 * | 11/2006 | Umemura et al. | 327/77 |
| 2009/0015267 A1 * | 1/2009 | Max | 324/620 |
| 2009/0033528 A1 * | 2/2009 | Kimura | 341/120 |
| 2009/0043528 A1 * | 2/2009 | Asami | 702/124 |

FOREIGN PATENT DOCUMENTS

| | | |
|---|---|---|
| EP | 0 859 318 | 9/1998 |
| EP | 0 864 977 | 9/1998 |
| EP | 0 882 991 | 12/1998 |
| EP | 0 886 214 | 12/1998 |
| EP | 1 092 983 | 4/2001 |
| JP | 2002-006004 | 5/2002 |
| WO | WO 01/06684 | 1/2001 |

OTHER PUBLICATIONS

International Search Report Mar. 2, 2005.
Written Opinion dated Mar. 2, 2005.

* cited by examiner

Primary Examiner—Michael P. Nghiem
Assistant Examiner—Cindy H Khuu

(57) ABSTRACT

A method and a corresponding system for testing an analog signal under test includes using knowledge of at least one parameter of the signal under test. The method includes generating a reference signal using the knowledge of at least one parameter of the signal under test, combining the generated reference signal with the signal under test, resulting in a combination signal, and evaluating the combination signal for testing the signal under test.

13 Claims, 4 Drawing Sheets

ANALOG SIGNAL TEST USING A-PRIORI INFORMATION

This application is the National Stage of International Application No. PCT/EP2005/050921, Publication No. WO 2006/092173, International Filing Date, 2 Mar. 2005, which designated the United States of America, which is incorporated herein in its entirety.

BACKGROUND ART

The present invention relates to testing an analog signal.

According to the known methods the signal under test is digitized using an analog-to-digital converter and the digitized signal under test is evaluated for testing the signal under test. One problem is that the distortion in the signal under test is sometimes small compared with to components of the ideal waveform of the signal under test and thus the analog-to-digital converter has to fulfil high-performance specifications, e.g. a big dynamic range for accurate conversion, in order to allow detection of small distortions in the signal under test.

If the ideal waveform of the signal under test is a sine wave, a notch filter can be used to suppress the main component of the signal under test thus relaxing the dynamic range requirements of the analog-to-digital converter. But a real notch filter is non-ideal and will also influence the distortion components in the signal under test which are to be measured. Furthermore, for testing signals with different frequencies a programmable notch filter has to be used which is expensive.

Testing of analog signals is known from, but not restricted to, Automated Test Equipment (ATE). Integrated Circuits (IC) generally need to be tested to assure proper operation. This—in particular—is required during IC development and manufacturing. In the latter case, the ICs are usually tested before final application. During test, the IC, as device under test (DUT), is exposed to various types of stimulus signals, and its responses are measured, processed and usually compared to an expected response of a good device. Automated Test Equipment (ATE) usually performs these tasks according to a device-specific test program. Examples for ATE are the AGILENT 83000 and 93000 families of Semiconductor Test Systems of AGILENT Technologies Details of those families are also disclosed e.g. in EP-A-859318, EP-A-864977, EP-A-886214, EP-A-882991, EP-A-1092983, U.S. Pat. No. 5,499,248, U.S. Pat. No. 5,453,995.

DISCLOSURE OF THE INVENTION

It is an object of the invention to provide an improved method and system for testing an analog signal. The object is achieved by the independent claims. Preferred embodiments are shown by the dependent claims.

According to embodiments of the present invention, knowledge of at least one parameter of said signal under test is used in order to generate a reference signal, e.g. to generate the expected waveform of the signal under test. By combining said generated reference signal with said signal under test, resulting in a combination signal, it can be achieved that the evaluation of said combination signal is simplified, e.g. since the combination signal has a smaller amplitude than said signal under test, in particular a smaller dynamic range of the amplitude. Such a combination signal can be evaluated with higher accuracy than the signal under test itself with its potential high dynamic range of amplitude. This is advantageous in particular if the distortion, e.g. noise and/or harmonics, i.e. the deviation of a signal under test from the ideal waveform, is much smaller than the signal under test itself. For example, the combination signal can be in the range of five to six decades smaller than the amplitude of the ideal waveform of the signal under test. Therefore, according to embodiments of the present invention, even a very small distortion can be detected by using a test equipment of relaxed specifications. It is emphasized that the improved method and system for testing an analog signal according to the invention is not limited to sinusoidal ideal waveforms of signals under test but applies also to general waveforms, including ramps, superposition of several sinusoidal wave forms, modulated signals of various kinds and video-signals (step functions).

The invention uses knowledge of at least one parameter of said signal under test, e.g. frequency and/or amplitude. The more information about the ideal waveform of the signal under test is available, the more accurate the reference signal will be, and thus the smaller the combination signal for testing said signal under test will be. Testing can mean e.g. a pass/fail test of the signal under test and/or a measurement of the signal under test. The present invention is very advantageous, but not restricted to, the application in the field of automated test equipment, since most commonly a device under test generates a wave form that is known, e.g. an expectation exists for the wave form generated by the device under test. An embodiment of the invention is simplified and thus of particular advantage, if the wave form of the signal to be tested is a sine wave or a superposition of sine waves. As an example, the ratio of unwanted harmonics and/or unwanted noise to components of the signal under test has to be determined. Testing can be performed by evaluating a digitized version of the signal under test using an algorithm for determining distortion like noise and harmonics. According to an embodiment of the present invention the reference signal is generated as a signal corresponding to an expectation of said signal under test, i.e. not all parameters of the signal under test have to be known. In particular, according to embodiments of the invention the combination signal can be evaluated in such a manner that at first unknown parameters of the signal under test can be determined, e.g. by varying the reference signal and analyzing the combination signal with respect to the variations of the reference signals.

Combining said generated reference signal with said signal under test can be performed by a comparison of said generated reference signal with said signal under test, wherein such a comparison may include mathematical operations applied to one of both signals and/or to both signals. In a preferred embodiment of the invention said combining comprises a subtraction operation, e.g. a subtraction of said generated reference signal and said signal under test. Preferably, said combining is performed using an analog form of each of both signals; accordingly, the reference signal is generated using a digital-to-analog converter.

In another embodiment of the invention the reference signal is generated using at least one oscillator, in particular if the signal under test is to be tested with reference to a sine waveform. In a preferred embodiment the reference signal as generated is filtered before combining said filtered generated reference signal with said signal under test. The filter can be used to shape the generated reference signal, e.g. for reducing distortion introduced by generating the reference signal.

In a preferred embodiment of the invention the combination signal is converted by an analog-to-digital converter into a digital combination signal. Evaluation for testing said signal under test is preferably made on the basis of said digital combination signal. The digital-to-analog converter which is used the generate the reference signal can be controlled by results of analyzing said combination signal, e.g. analyzing said digital combination signal, in order to optimize said reference signal. For example the digital-to-analog converter is controlled such that the combination signal is minimized, e.g. the difference signal formed by the subtraction operation of said generated reference signal and said signal under test is minimized. For minimization an appropriate algorithm can be used. A control element can be used in the corresponding testing system to output control signals to the digital-to-analog converter or the corresponding oscillator. Such embodiments are advantageous since it is not required to know all parameters of the signal under test at first, but it would be sufficient to know only one or more parameters and to optimize the reference signal without knowledge of the remaining parameters at first.

In a preferred embodiment the digital-to-analog converter for generating the reference signal is controlled by results of the analysis of said combination signal in order to optimize said reference signal.

In a preferred embodiment of the invention the combination signal is evaluated by a root-mean square (RMS) meter as an alternative or in addition to an analog-digital-converter. Accordingly the energy represented by the combination signal is measured as a value for testing the signal under test, e.g. such an energy value is zero for an ideal signal under test.

Embodiments of the invention can be partly or entirely embodied or supported by one or more suitable software programs, which can be stored on or otherwise provided by any kind of data carrier, and which might be executed in or by any suitable data processing unit. Software programs or routines are preferably applied for the optimization of the generated reference signal, e.g. the control of the digital-to-analog converter, or the evaluation of the combination signal.

BRIEF DESCRIPTION OF DRAWINGS

Other objects and many of the attendant advantages of embodiments of the present invention will be readily appreciated and become better understood by reference to the following more detailed description of embodiments in connection with the accompanied drawings. Features that are substantially or functionally equal or similar will be referred to by the same reference signs.

FIG. 1 shows a block diagram of a first embodiment of the invention, i.e. a block diagram of a first embodiment of the inventive system 10 for testing an analog signal under test 12. The signal under test 12 is inputted to a means 14 for combining said signal under test 12 with a reference signal 16 which is generated by a digital-to-analog converter DAC 18. The means 14 for combining in this first embodiment is a subtraction element outputting a combination signal 20. Since the signal under test 12 as well as the reference signal 16 is an analog signal, the combination signal 20 also is an analog signal.

Figure 1:
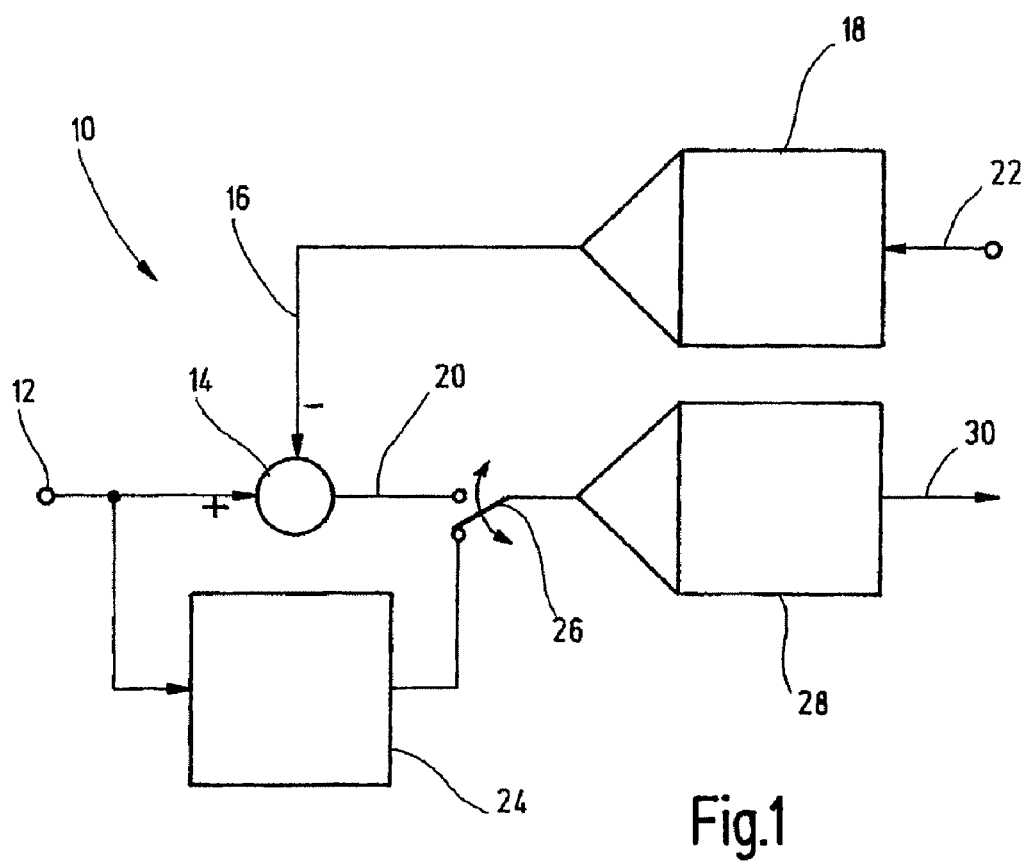
FIG. 1 shows a block diagram of a first embodiment of the invention.

The reference signal 16 generated by the DAC 18 is a signal corresponding to an expectation of said signal under test 12. E.g., if the signal under test 12 is a sine wave, the DAC 18 generates a reference signal 16 which is, or at least should be, an ideal sine wave. Accordingly, the combination signal 20 represents only the distortion in the signal under test 12. As a result, the combination signal 20 usually shows a much smaller amplitude than the signal under test 12.

In the first embodiment the parameters of said signal under test 12 known to the inventive system 10 are e.g. the amplitude and the frequency of the expected signal under test 12. Those parameters are inputted in the DAC 18 via a control signal 22. If none or not enough parameters of the signal under test 12 are known a priori, it is possible to derive at least one or some of such parameters from the signal under test 12 itself.

For this purpose, in the first embodiment the signal under test 12 is inputted to an attenuation element 24, which attenuates the amplitude of the signal under test 12 to a value similar to a usual combination signal 20. Using the switch 26 the output of the attenuation element 24 is inputted in the analog-to-digital converter ADC 28 which converts the attenuated signal under test 12 into a digital output signal 30 representing the signal under test 12. Using an algorithm and digital processing means, the parameters of the signal under test 12 can be analyzed from the digital output signal 30 of the ADC 28. The extracted parameters can be used to provide the control signal 22 for the DAC 18.

Once the necessary parameters to generate an appropriate reference signal 16 are extracted from the signal under test 12, the switch 26 connects the input of the ADC 28 to the output of the means 14 for combining, i.e. the combination signal 20 is inputted to the ADC 28. Although an evaluation for testing of said signal under test 12 from the combination signal 20 is possible, for many applications it would be advantageous to evaluate said combination signal 20 in a digital form as represented by the digital output signal 30 of the ADC 28.

Figure 2:
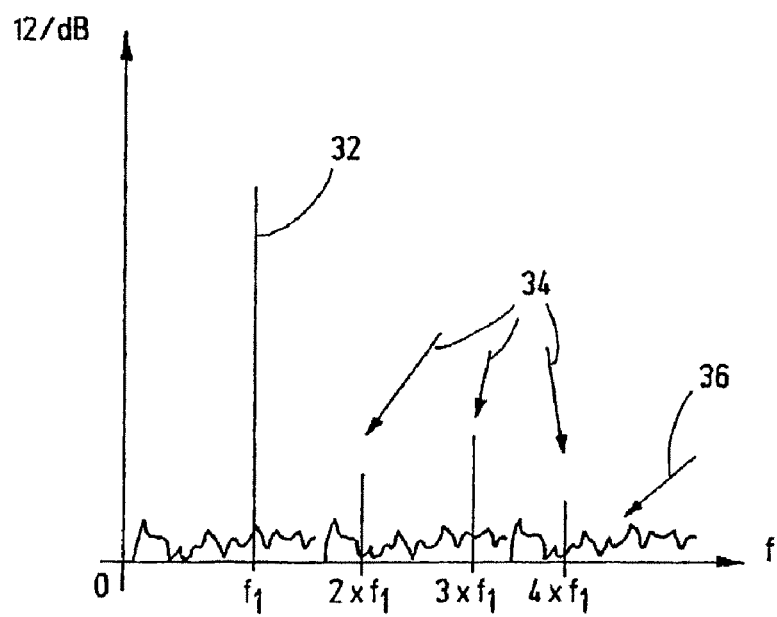
FIG. 2 shows a spectrum of the signal under test 12 over the frequency f.

FIG. 2 shows the spectrum of the signal under test 12 over the frequency f. As shown, the signal under test 12 comprises not only the first harmonic 32 at desired frequency f1, but also undesired further harmonics 34 at 2×f1, 3×f1, 4×f1 etc. and furthermore a noise component 36. Evaluation according to the present invention, in the first embodiment shown in FIG. 1 either on the basis of the combination signal 20 or on the basis of the digital output signal 30 of the ADC 28, identifies the further undesired harmonics 34 and/or the noise component 36 and thus allows e.g. a pass/fail test of the signal under test 12 according to predetermined specifications, or even a measurement of the quantitative ratio of the further harmonics and/or of the noise component to components of the signal under test 12. Preferably, for evaluation the same digital processing means are used as for extracting the control signal 22 for the DAC 18.

Since the reference signal 16 is a signal corresponding to an expectation of said signal under test 12, as a result of the combining of the reference signal 16 and the signal under test 12 only the deviations of the signal under test 12 from the generated reference signal 16 are to be measured. This advantageously relaxes the specification for the ADC 28 and therefore allows testing with high accuracy at high speed and low costs. In addition, the inventive method does not require necessarily difficult and expensive filters, in particular notch filters, programmable filters etc. Furthermore, the use of a DAC 18 for the generation of the reference signal 16, which usually outperforms analog-to-digital converters concerning accuracy, allows the application of the inventive method for all types of waveform for the signal under test 12.

The signal under test 12 can be an output signal from any kind of element or apparatus, including an output signal of a signal generator, a clock etc. In a preferred embodiment, the signal under test 12 is the output signal of a device under test DUT, e.g. an integrated circuit IC tested by an automated test equipment ATE.

Figure 3:
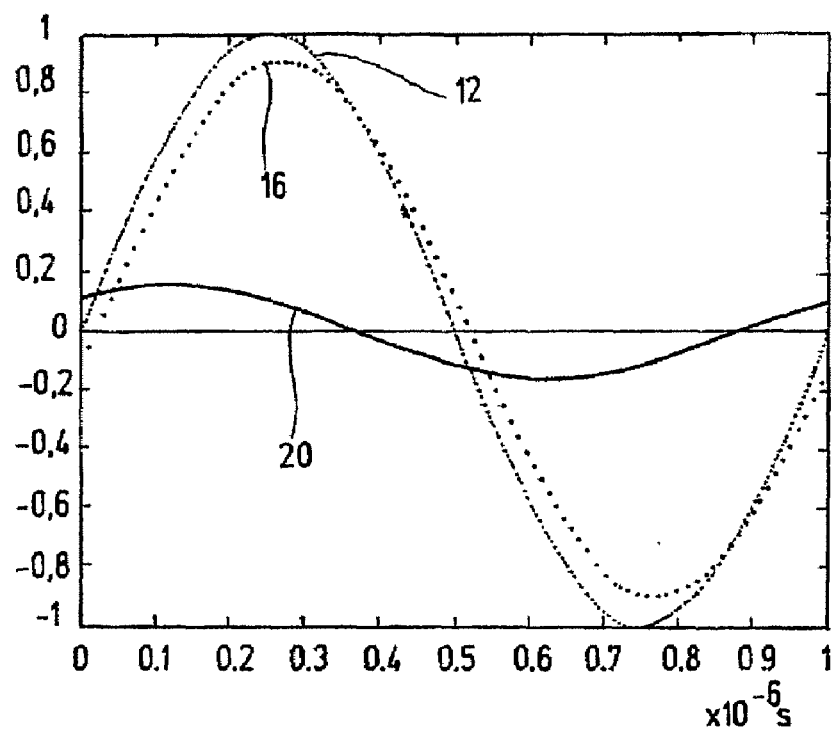
FIG. 3 shows in normalized form, the signal under test 12 as well as a reference signal 16.

FIG. 3 shows in normalized form, the signal under test 12 as well as a reference signal 16. Due to an amplitude error of the reference signal 16 in relation to the signal under test 12 of about 10% in amplitude and a time-skew of about 20 ns, the combination signal 20 is also a sine wave, but the combination signal 20 has an amplitude reduced by a factor of 10 in relation to the signal under test 12. Accordingly, the specification for the ADC 28 concerning dynamic range is reduced by the same factor, which is very advantageous in view of accuracy, stability and cost.

Figure 4:
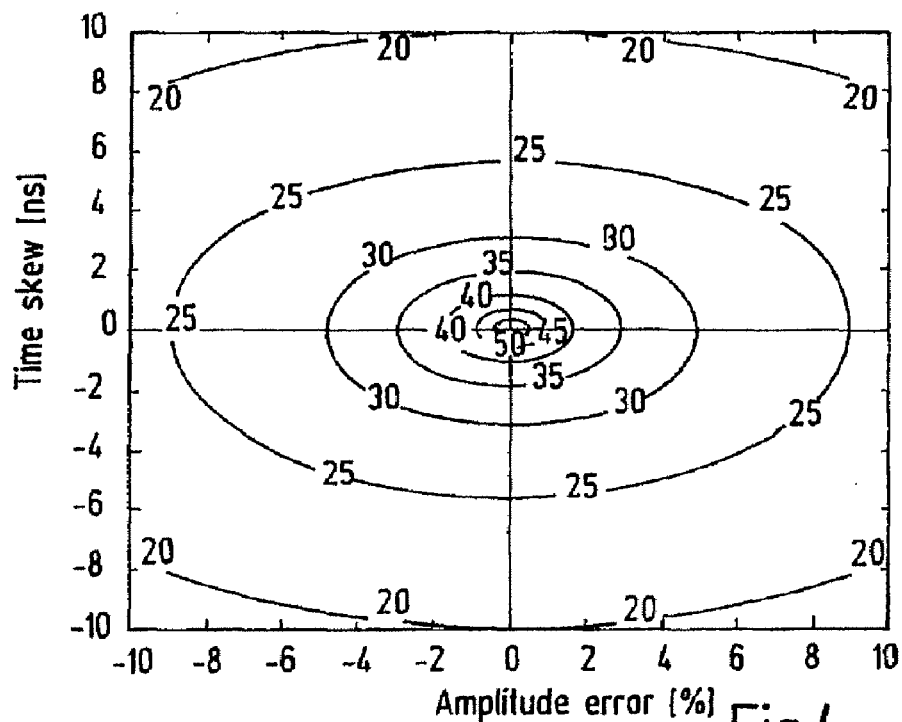
FIG. 4 shows the dependency of the specification for the ADC.

FIG. 4 shows how the specification for the ADC 28 concerning dynamic range depends on error of amplitude and phase (skew) of the reference signal 16 in relation to the signal under test 12. As can be seen, the reduction of the dynamic range is more than 50 dB for a signal frequency of 1 MHz, if the amplitude error is less than 1% and the time skew error is less than 1 ns.

Figure 5:
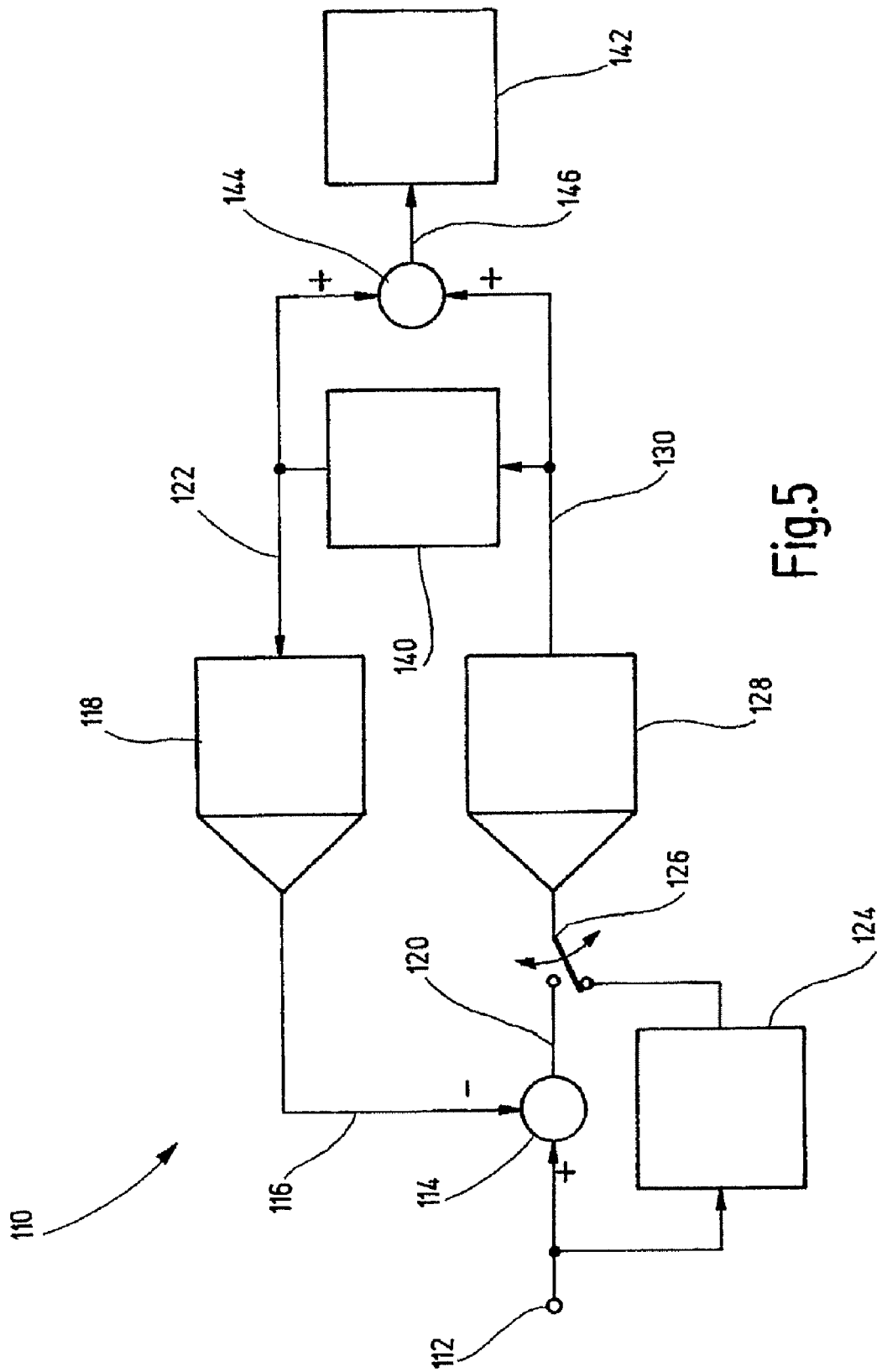
FIG. 5 shows a block diagram of a second embodiment of the invention.

FIG. 5 shows a block diagram of a second embodiment of the inventive system 110. This embodiment is able to optimize at first unknown parameters of the signal under test 112. In the left part of the block diagram, the system 110 is identical to the first embodiment shown in FIG. 1. In particular, the means 114 for combining is also realized as a subtracting means, subtracting the reference signal 116 from the signal under test 112. Nevertheless, it has to be noted, that other combining operations are possible, in particular combining operations that perform other linear or even non-linear functions, as far as the particular function is taken into consideration for evaluating said combination signal 120.

In the second embodiment the output signal 130 is inputted to a control element 140, which outputs the control signal 122 for the DAC 118. If e.g. the signal under test 112 is a sine wave, the control element 140 may vary the parameters for amplitude and/or frequency and/or phase of the reference signal 116 to be generated by the DAC 118 while monitoring the output signal 130. For further example, by monitoring the output signal 130, the control signal 122 is varied in a way that the energy equivalent of output signal 130 is minimized, in particular the energy equivalent of the proportions of the unwanted further harmonics 34 in the signal under test 112. Therefore, the combination signal 120 is minimized, and therefore the dynamic range improvement for the ADC 128 is optimized. As a further advantage, in particular in combination with the attenuation element 124, none of the parameters of the signal under test 112 has to be known a priori but can be derived from the digital output signal 130 by the control element 140.

Furthermore, the digital output signal 130 as well as the control signal 122 is inputted to an evaluation element 142 for testing said signal under test 112. For joining the output signal 130 and the control signal 122 an adder element 144 can be used which output signal 146 is inputted to the evaluation element 142.

Figure 6:
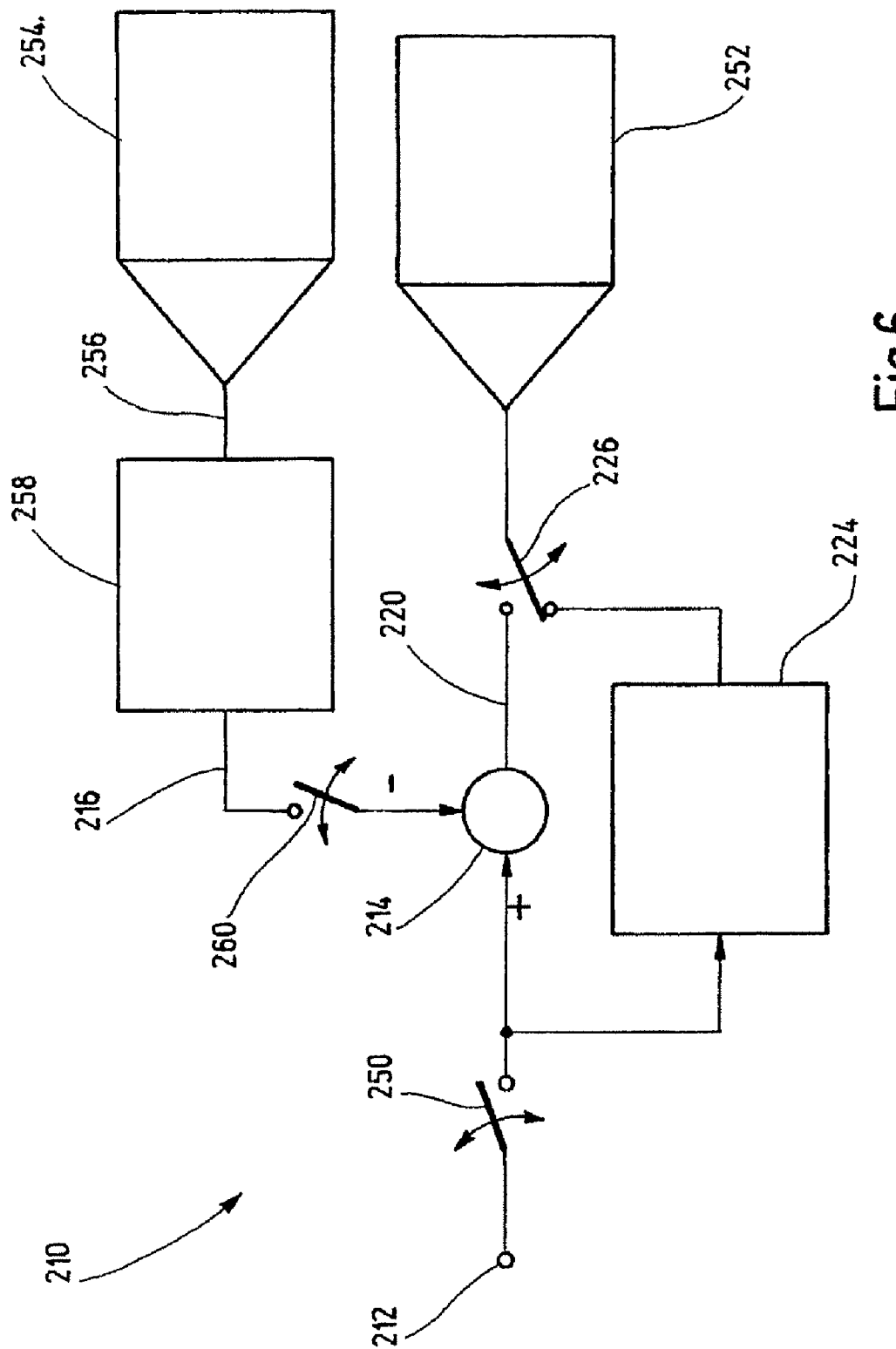
FIG. 6 shows a block diagram of a third embodiment of the invention.

FIG. 6 shows a block diagram of a third embodiment of an inventive system 210. Similar to the first and second embodiment, the signal under test 212 can be connected via a second switch 250 to the means 214 for combining as well as to the attenuation element 224. The combination signal 220 or the attenuated signal under test 212 is connected via a switch 226 to a root-mean-square (RMS) meter 252. The RMS meter 252 is advantageous in particular, if the system 210 has to perform a sine waveform test.

Accordingly, instead of the DAC of the first and second embodiment, in the third embodiment an oscillator 254 is used. The oscillator output signal 256, which can be regarded as an original reference signal generated by the oscillator 254, is subjected to a filtering operation, i.e. inputted in a filter element 258. The filter element 258 can be realized e.g. as a notch filter and is able to eliminate or at least reduce distortion and particularly unwanted harmonics generated by said oscillator 254. Accordingly, the output of the notch filter 258 provides the reference signal 216 which could be connected via the third switch 260 to the means 214 for combining. The third embodiment is advantageous with regard e.g. to the filter element 258 which is much easier to realize because it is not present in the signal path of the signal under test, but only in the path of generating the reference signal 216. Thus the to-be-measured distortion of the signal under test 212 is not changed inadvertently and the filter element 258 is easier to design because there are no hard requirements on its frequency response, as long as it allows propagation of the oscillator output signal 256 along filter element 258 to become reference signal 216.

It has to be noted that instead of an oscillator 254 obviously in the third embodiment also a digital-to-analog converter DAC similar to that in the first and second embodiment can be used. For the same reason, instead of the root-mean-square meter 252, the analog-to-digital converter ADC shown in the first and second embodiment can be used. In such case it is furthermore possible to loop back from the DAC to the ADC or RMS meter 252 in order to calibrate determined distortions from the DAC.

As a simple way to determine the quality of a signal under test 212 for the case that the ideal signal is a pure sine signal, the third embodiment shown in FIG. 6 may be used in the following manner: The DAC/oscillator 254 is set to the wanted sine signal frequency (f1 in FIG. 2) and amplitude. The notch filter 258 is not present in this case. The combination signal 220 will now represent all other spectrum components 34 including noise component 36 shown in FIG. 2 but the component 32 at f1. The ratio of the amplitude of the reference signal 216 to the combination signal 220 now represents a simple measure of the quality of the signal under test 212.

The invention claimed is:

1. A method for testing an analog signal under test using knowledge of at least one parameter of said signal under test, said method comprising:
    using a reference signal generating means for generating a reference signal using said knowledge of at least one parameter of said signal under test, wherein said reference signal corresponds to an expectation of said signal under test,
    using a combining means for combining said generated reference signal with said signal under test, resulting in a combination signal,
    using a control element to generate a control signal for controlling the reference signal; and
    using an evaluation element to evaluate a digital form of said combination signal combined with said control signal for testing said signal under test.

2. The method of claim 1, wherein testing said signal under test comprises performing a pass/fail test of the signal under test according to predetermined specifications.

3. The method of claim 1, wherein said reference signal is chosen such that said combination signal has a smaller amplitude than said signal under test.

4. The method of claim 1, wherein combining said generated reference signal with said signal under test comprises a comparison of said generated reference signal with said signal under test.

5. The method of claim 1, wherein combining said generated reference signal with said signal under test comprises a subtraction operation of said generated reference signal and said signal under test.

6. The method of claim 1, wherein said reference signal is generated using a digital-to-analog converter.

7. The method of claim 6, wherein said digital-to-analog converter is controlled according to results of an analysis of said combination signal to optimize said reference signal.

8. The method of claim 1, wherein said reference signal is generated using an oscillator.

9. The method of claim 1, wherein said generating of said reference signal is followed by a filtering operation.

10. The method of claim 1, wherein said combination signal is evaluated by a root-mean-square (RMS) meter.

11. The method of claim 1, wherein said combination signal is converted by an analog-to-digital converter into a digital combination signal and that said evaluation is made on the basis of said digital combination signal.

12. A software program or product, embodied on a computer readable medium, for executing the method of claim 1, when run on a data processing system.

13. A system for testing an analog signal under test using knowledge of at least one parameter of said signal under test, said system comprising:
   means for generating a reference signal using said knowledge of at least one parameter of said signal under test, wherein said reference signal corresponds to an expectation of said signal under test,
   means for combining said generated reference signal with said signal under test, resulting in a combination signal,
   a controller configured to generate a control signal for controlling the reference signal; and
   means for evaluating a digital form of said combination signal combined with said control signal for testing said signal under test.

* * * * *

UNITED STATES PATENT AND TRADEMARK OFFICE
CERTIFICATE OF CORRECTION

| | | |
|---|---|---|
| PATENT NO. | : 7,672,804 B2 | Page 1 of 1 |
| APPLICATION NO. | : 11/897847 | |
| DATED | : March 2, 2010 | |
| INVENTOR(S) | : Jochen Rivoir | |

It is certified that error appears in the above-identified patent and that said Letters Patent is hereby corrected as shown below:

Delete the paragraph at column 1, lines 4-8 in its entirety.

Insert the following new paragraph in column 1, line 1 after the title:

--This application is a continuation application under 35 U.S.C. 120 of International Application No. PCT/EP2005/050921 having an international filing date of March 2, 2005, and which designated the United States of America, and which is incorporated herein in its entirety.--

Signed and Sealed this
Fourth Day of September, 2012

David J. Kappos
*Director of the United States Patent and Trademark Office*